(12) United States Patent
Takachi et al.

(10) Patent No.: US 11,044,571 B2
(45) Date of Patent: Jun. 22, 2021

(54) PROCESSING DEVICE, PROCESSING METHOD, AND PROGRAM

(71) Applicant: JVCKENWOOD CORPORATION, Yokohama (JP)

(72) Inventors: Kuniaki Takachi, Yokohama (JP); Hisako Murata, Yokohama (JP); Yumi Fujii, Yokohama (JP); Takahiro Gejo, Yokohama (JP); Masaya Konishi, Yokohama (JP)

(73) Assignee: JVCKENWOOD CORPORATION, Yokohama (JP)

(*) Notice: Subject to any disclaimer, the term of this patent is extended or adjusted under 35 U.S.C. 154(b) by 0 days.

(21) Appl. No.: 16/817,257

(22) Filed: Mar. 12, 2020

(65) Prior Publication Data
US 2020/0213802 A1 Jul. 2, 2020

Related U.S. Application Data

(63) Continuation of application No. PCT/JP2018/033622, filed on Sep. 11, 2018.

(30) Foreign Application Priority Data

Sep. 27, 2017 (JP) .............................. JP2017-186164

(51) Int. Cl.
 *H04R 3/04* (2006.01)
 *H04S 1/00* (2006.01)
 *H04S 7/00* (2006.01)

(52) U.S. Cl.
 CPC ............... *H04S 7/307* (2013.01); *H04R 3/04* (2013.01); *H04S 1/007* (2013.01); *H04S 2420/07* (2013.01)

(58) Field of Classification Search
CPC ...... H04S 7/307; H04S 1/007; H04S 2420/07; H04R 3/04
See application file for complete search history.

(56) References Cited

U.S. PATENT DOCUMENTS

2008/0031462 A1* 2/2008 Walsh ....................... H04S 3/02
 381/17
2019/0222932 A1 7/2019 Ishizuka et al.

FOREIGN PATENT DOCUMENTS

JP 2012100195 A 5/2012
NO 2018/062406 A1 4/2018

OTHER PUBLICATIONS

Tanaka, Translation of JP2012100195, "Acoustic Processing Device", May 24, 2012, Google Patents.*

* cited by examiner

*Primary Examiner* — Regina N Holder
(74) *Attorney, Agent, or Firm* — Procopio, Cory, Hargreaves & Savitch LLP

(57) ABSTRACT

A filter determination system, a filter determination device, a filter determination method and a program with which a filter can be appropriately determined are provided.
A processing device according to this embodiment includes a frequency response acquisition unit that acquires a frequency response of a filter for an audio signal, a smoothing unit that smoothes the frequency response and obtains a smoothed response, a candidate point determination unit that determines candidate split points based on a bottom position of the smoothed response, and a split point determination unit that determines one or more band split points from the candidate split points.

6 Claims, 6 Drawing Sheets

PROCESSING DEVICE, PROCESSING METHOD, AND PROGRAM

CROSS REFERENCE TO RELATED APPLICATION

This application is a Bypass Continuation of International Application No. PCT/JP2018/033622 filed on Sep. 11, 2018, which is based upon and claims the benefit of priority from Japanese patent application No. 2017-186164 filed on Sep. 27, 2017, the disclosure of which is incorporated herein in its entirety by reference.

BACKGROUND

The present invention relates to a processing device, a processing method, and a program.

Patent Literature 1 (Japanese Unexamined Patent Application Publication No. 2012-100195) discloses an acoustic processing device that adjusts the signal level of an acoustic signal. The acoustic processing device disclosed in Patent Literature 1 functions as an effect imparting device (compressor) that reduces the fluctuation range (dynamic range) of the signal level of an input acoustic signal and generates an output acoustic signal.

Specifically, the acoustic processing device splits an acoustic signal into N number of frequency bands. The acoustic processing device then sets N number of adjustment values (candidate values) corresponding to the N number of frequency bands to be variable. The acoustic processing device selects, from the N number of adjustment values, an adjustment value G to be applied to signal adjustment. The adjustment value G is applied to generation of an output acoustic signal from an input acoustic signal.

SUMMARY

However, Patent Literature 1 discloses nothing about a method of determining a frequency (which is referred to hereinafter as a band split point) at the boundary of a band when performing band splitting. If the band split point is determined at random, there is a possibility that appropriate signal processing cannot be achieved.

For example, sound localization techniques include an out-of-head localization technique, which localizes sound images outside the head of a listener by using headphones. The out-of-head localization technique localizes sound images outside the head by canceling characteristics from the headphones to the ears and giving four characteristics (spatial acoustic transfer characteristics) from stereo speakers to the ears.

In out-of-head localization reproduction, measurement signals (impulse sounds etc.) that are output from 2-channel (which is referred to hereinafter as "ch") speakers are recorded by microphones (which can be also called "mike") placed on the ears of a listener (user). Then, a processing device generates a filter based on a sound pickup signal obtained by impulse response. The generated filter is convolved to 2-ch audio signals, thereby implementing out-of-head localization reproduction.

Because the filter used for out-of-head localization is based on the characteristics of an individual user, if the band split point is not appropriate, the effect of out-of-head localization cannot be sufficiently obtained in some cases. Thus, there is a need for a method of appropriately setting the band split point so as not to undermine the effect of out-of-head localization.

The present embodiment has been accomplished to solve the above problems and an object of the present invention is thus to provide a processing device, a processing method, and a program capable of appropriately setting a band split point.

A processing device according to an embodiment includes a frequency response acquisition unit configured to acquire a frequency response of a filter for an audio signal, a smoothing unit configured to smooth the frequency response and obtain a smoothed response, a candidate point determination unit configured to determine a plurality of candidate split points based on a bottom position of the smoothed response, and a split point determination unit configured to determine one or more band split points based on the plurality of candidate split points.

A processing method according to an embodiment includes a step of acquiring a frequency response of a filter for an audio signal, a step of smoothing the frequency response and obtaining a smoothed response, a step of determining a plurality of candidate split points based on a bottom position of the smoothed response, and a step of determining one or more band split points based on the plurality of candidate split points.

A program according to an embodiment is a program that causes a computer to execute a processing method including a step of acquiring a frequency response of a filter for an audio signal, a step of smoothing the frequency response and obtaining a smoothed response, a step of determining a plurality of candidate split points based on a bottom position of the smoothed response, and a step of determining one or more band split points based on the plurality of candidate split points.

DETAILED DESCRIPTION

The overview of a sound localization process using a filter generated by a signal processing device according to an embodiment is described hereinafter. An out-of-head localization process according to this embodiment performs out-of-head localization by using spatial acoustic transfer characteristics and ear canal transfer characteristics. The spatial acoustic transfer characteristics are transfer characteristics from a sound source such as speakers to the ear canal. The ear canal transfer characteristics are transfer characteristics from the entrance of the ear canal to the eardrum. In this embodiment, out-of-head localization is implemented by measuring the spatial sound transfer characteristics when headphones or earphones are not worn, measuring the ear canal transfer characteristics when headphones or earphones are worn, and using those measurement data.

Out-of-head localization according to this embodiment is performed by a user terminal such as a personal computer, a smart phone, or a tablet PC. The user terminal is an information processor including a processing means such as a processor, a storage means such as a memory or a hard disk, a display means such as a liquid crystal monitor, and an input means such as a touch panel, a button, a keyboard and a mouse. The user terminal may have a communication function to transmit and receive data. Further, an output means (output unit) with headphones or earphones is connected to the user terminal.

First Embodiment (Out-of-Head Localization Device)

Figure 1:
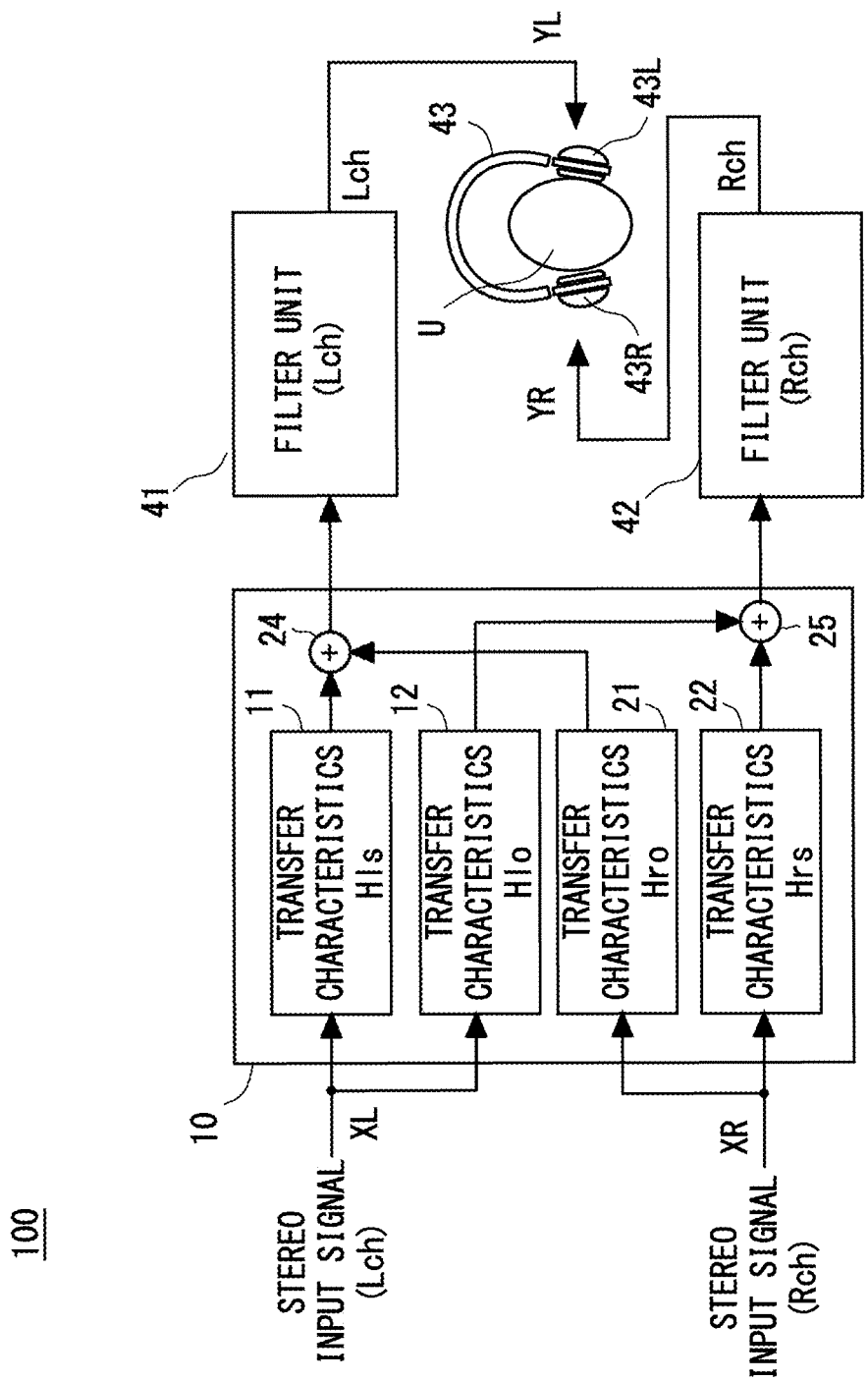
FIG. 1 is a block diagram showing an out-of-head localization device according to an embodiment.

FIG. 1 shows an out-of-head localization device 100, which is an example of a sound field reproduction device according to this embodiment. FIG. 1 is a block diagram of the out-of-head localization device 100. The out-of-head localization device 100 reproduces sound fields for a user U who is wearing the headphones 43. Thus, the out-of-head localization device 100 performs sound localization for L-ch and R-ch stereo input signals XL and XR. The L-ch and R-ch stereo input signals XL and XR are analog audio reproduced signals that are output from a CD (Compact Disc) player or the like or digital audio data such as mp3 (MPEG Audio Layer-3). Note that the audio reproduced signals or the digital audio data are collectively referred to as reproduced signals. Thus, the L-ch and R-ch stereo input signals XL and XR are the reproduced signals. Note that the out-of-head localization device 100 is not limited to a physically single device, and a part of processing may be performed in a different device. For example, a part of processing may be performed by a personal computer or the like, and the rest of processing may be performed by a DSP (Digital Signal Processor) included in the headphones 43 or the like.

The out-of-head localization device 100 includes an out-of-head localization unit 10, a filter unit 41, a filter unit 42, and the headphones 43. The out-of-head localization unit 10, the filter unit 41 and the filter unit 42 can be implemented by, to be specific, a processor or the like.

The out-of-head localization unit 10 includes convolution calculation units 11 to 12 and 21 to 22, and adders 24 and 25. The convolution calculation units 11 to 12 and 21 to 22 perform convolution processing using the spatial acoustic transfer characteristics. The stereo input signals XL and XR from a CD player or the like are input to the out-of-head localization unit 10. The spatial acoustic transfer characteristics are set to the out-of-head localization unit 10. The out-of-head localization unit 10 convolves a filter of the spatial acoustic transfer characteristics (which is referred hereinafter also as a spatial acoustic filter) into each of the stereo input signals XL and XR having the respective channels. The spatial acoustic transfer characteristics may be a head-related transfer function HRTF measured in the head or auricle of a measured person, or may be the head-related transfer function of a dummy head or a third person.

The spatial acoustic transfer characteristics are a set of four spatial acoustic transfer characteristics Hls, Hlo, Hro and Hrs. Data used for convolution in the convolution calculation units 11 to 12 and 21 to 22 is a spatial acoustic filter. The spatial acoustic filter is generated by cutting out the spatial acoustic transfer characteristics Hls, Hlo, Hro and Hrs with a specified filter length.

Each of the spatial acoustic transfer characteristics Hls, Hlo, Hro and Hrs is acquired in advance by impulse response measurement or the like. For example, the user U wears microphones on the left and right ears, respectively.

Left and right speakers placed in front of the user U output impulse sounds for performing impulse response measurement. Then, the microphones pick up measurement signals such as the impulse sounds output from the speakers. The spatial acoustic transfer characteristics Hls, Hlo, Hro and Hrs are acquired based on sound pickup signals in the microphones. The spatial acoustic transfer characteristics Hls between the left speaker and the left microphone, the spatial acoustic transfer characteristics Hlo between the left speaker and the right microphone, the spatial acoustic transfer characteristics Hro between the right speaker and the left microphone, and the spatial acoustic transfer characteristics Hrs between the right speaker and the right microphone are measured.

The convolution calculation unit 11 convolves the spatial acoustic filter in accordance with the spatial acoustic transfer characteristics Hls to the L-ch stereo input signal XL. The convolution calculation unit 11 outputs convolution calculation data to the adder 24. The convolution calculation unit 21 convolves the spatial acoustic filter in accordance with the spatial acoustic transfer characteristics Hro to the R-ch stereo input signal XR. The convolution calculation unit 21 outputs convolution calculation data to the adder 24. The adder 24 adds the two convolution calculation data and outputs the data to the filter unit 41.

The convolution calculation unit 12 convolves the spatial acoustic filter in accordance with the spatial acoustic transfer characteristics Hlo to the L-ch stereo input signal XL. The convolution calculation unit 12 outputs convolution calculation data to the adder 25. The convolution calculation unit 22 convolves the spatial acoustic filter in accordance with the spatial acoustic transfer characteristics Hrs to the R-ch stereo input signal XR. The convolution calculation unit 22 outputs convolution calculation data to the adder 25. The adder 25 adds the two convolution calculation data and outputs the data to the filter unit 42.

An inverse filter that cancels out the headphone characteristics (characteristics between a reproduction unit of headphones and a microphone) is set to the filter units 41 and 42. Then, the inverse filter is convolved to the reproduced signals (convolution calculation signals) on which processing in the out-of-head localization unit 10 has been performed. The filter unit 41 convolves the inverse filter of the L-ch headphone characteristics to the L-ch signal from the adder 24. Likewise, the filter unit 42 convolves the inverse filter of the R-ch headphone characteristics to the R-ch signal from the adder 25. The inverse filter cancels out the characteristics from the headphone unit to the microphone when the headphones 43 are worn. The microphone may be placed at any position between the entrance of the ear canal and the eardrum. The inverse filter is calculated from a result of measuring the characteristics of the user U as described later.

The filter unit 41 outputs a processed L-ch signal YL to a left unit 43L of the headphones 43. The filter unit 42 outputs a processed R-ch signal YR to a right unit 43R of the headphones 43. The user U is wearing the headphones 43. The headphones 43 output the L-ch signal YL and the R-ch signal YR (the L-ch signal YL and the R-ch signal YR are hereinafter referred to collectively as stereo signals) toward the user U. It is thereby possible to reproduce sound images localized outside the head of the user U. Further, DRC processing is performed on the stereo signals YL and YR as described later.

As described above, the out-of-head localization device 100 performs out-of-head localization by using the spatial acoustic filters in accordance with the spatial acoustic transfer characteristics Hls, Hlo, Hro and Hrs and the inverse filters of the headphone characteristics. In the following description, the spatial acoustic filters in accordance with the spatial acoustic transfer characteristics Hls, Hlo, Hro and Hrs and the inverse filter of the headphone characteristics are referred to collectively as an out-of-head localization filter. In the case of 2ch stereo reproduced signals, the out-of-head localization filter is composed of four spatial acoustic filters and two inverse filters. The out-of-head localization device 100 then carries out convolution calculation on the stereo reproduced signals by using the total six out-of-head localization filters and thereby performs out-of-head localization. The out-of-head localization filters are preferably based on measurement of the individual user U. For example, the out-of-head localization filters are set based on sound pickup signals picked up by the microphones worn on the ears of the user U.

As described above, the spatial acoustic filters and the inverse filters of the headphone characteristics are filters for audio signals. Those filters are convolved to the reproduced signals (stereo input signals XL and XR), and thereby the out-of-head localization device 100 carries out out-of-head localization. Further, in this embodiment, the processing device performs dynamic range compression (DRC) on the reproduced signals. Specifically, the out-of-head localization unit 10 performs out-of-head localization on the reproduced signals on which DRC processing has been performed.

Figure 2:
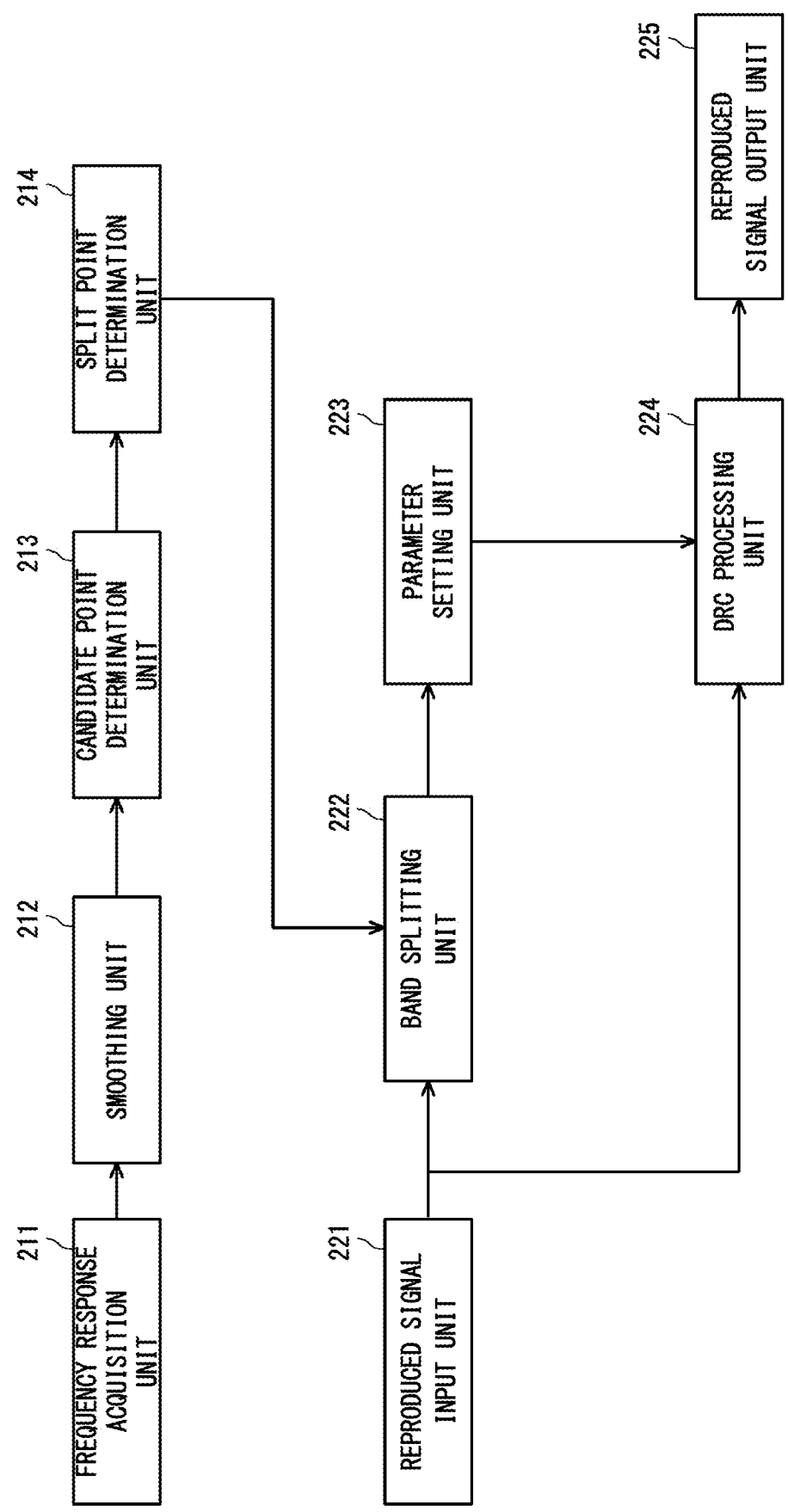
FIG. 2 is a control block diagram showing the structure of a processing device that performs dynamic range compression.

A processing device 200 that performs DRC processing on reproduced signals is described hereinafter with reference to FIG. 2. The processing device 200 includes a frequency response acquisition unit 211, a smoothing unit 212, a candidate point determination unit 213, a split point determination unit 214, a reproduced signal input unit 221, a band splitting unit 222, a parameter setting unit 223, a DRC processing unit 224, and a reproduced signal output unit 225. The reproduced signals are audio signals or, to be specific, the stereo signals YL and YR output from the filter units 41 and 42 in FIG. 1.

Note that the processing device 200 may be the same device as or a different device from the out-of-head localization device 100. For example, one single out-of-head localization device 100 may include the control blocks shown in FIG. 2. When the out-of-head localization device 100 and the processing device 200 are physically different devices, the processing device 200 outputs the reproduced signals on which DRC processing has been performed to the out-of-head localization device 100.

Further, a part of the processing device 200 may be included in the out-of-head localization device 100. In this case, the DRC processing unit 224 and the reproduced signal output unit 225, for example, may be included in the out-of-head localization device 100. Then, the processing device 200 outputs parameters for DRC Processing to the out-of-head localization device 100.

The frequency response acquisition unit 211 acquires the frequency response of filters. The filters may be the inverse filters of the headphone characteristics, or the spatial acoustic filters in accordance with the spatial acoustic transfer characteristics Hls, Hlo, Hro and Hrs. Specifically, the frequency response acquisition unit 211 acquires at least one frequency response of the out-of-head localization filters.

The frequency response acquisition unit 211 calculates a spectrum in the frequency domain from a filter in the time domain by FFT (fast Fourier transform). The amplitude response (amplitude spectrum) and the phase response (phase spectrum) of the filter are thereby generated. Note that a power spectrum may be generated instead of the amplitude spectrum. The frequency response acquisition unit 211 can transform the filter into data in the frequency domain (frequency response) by discrete Fourier transform or discrete cosine transform. The out-of-head localization device 100 may output the frequency response to the processing device 200 as a matter of course.

To use the stereo reproduced signals, the processing device 200 performs the same processing on the L-ch signal YL and the R-ch signal YR. For example, in the case of Lch, the inverse filter stored in the filter unit 41 or the filter of the spatial acoustic transfer characteristics Hls stored in the convolution calculation unit 11 can be used. In the case of Rch, the inverse filter stored in the filter unit 42 or the filter of the spatial acoustic transfer characteristics Hrs stored in the convolution calculation unit 21 can be used. Alternatively, a common band split point may be set for Lch and Rch.

Figure 3:
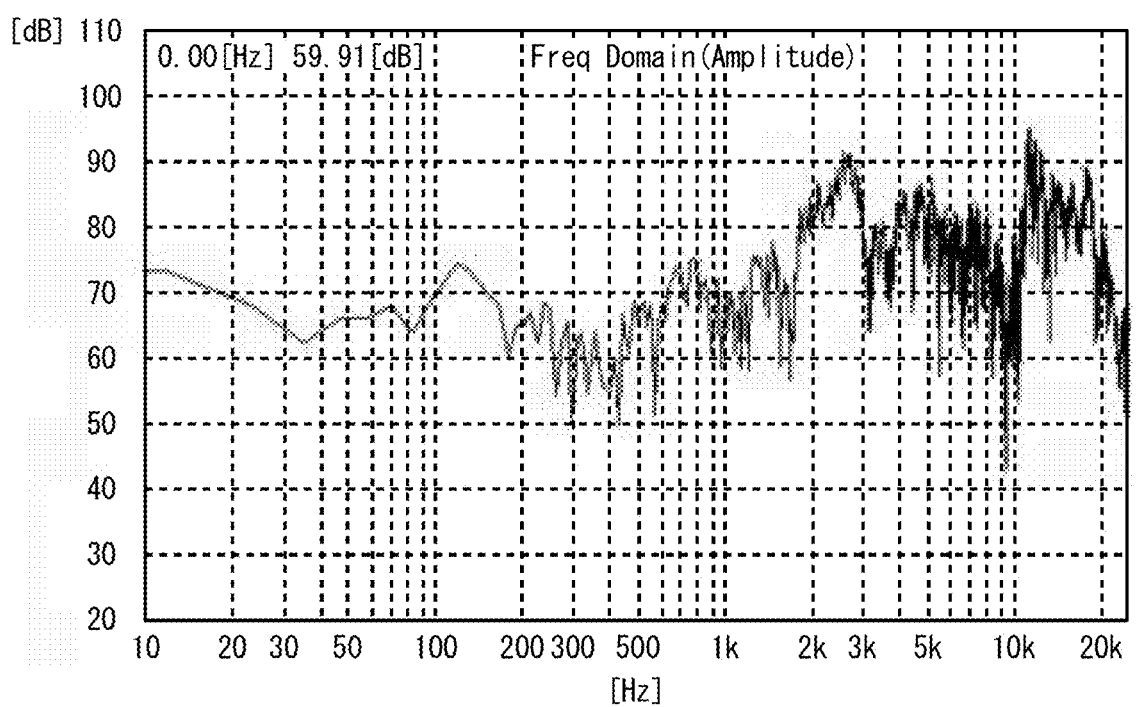
FIG. 3 is a graph showing the frequency response of a filter.

FIG. 3 is a graph showing the frequency-amplitude response (amplitude spectrum) of a filter. In FIG. 3, the horizontal axis indicates the frequency (Hz), and the vertical axis indicates the amplitude [dB].

The smoothing unit 212 smoothes the frequency response and obtains the smoothed response. Specifically, a response after smoothing is performed on the frequency response is the smoothed response. For example, an envelope detection method, an approximation method using a spline curve or the like may be used. Note that a smoothing method is not particularly limited.

The candidate point determination unit 213 determines a candidate point, which is a candidate for a band split point, based on the bottom position of the smoothed response. The candidate point determination unit 213 may determine a point (frequency) at which the smoothed response reach its local minimum (bottom) as the candidate point. For example, the candidate point determination unit 213 calculates the slope of the smoothed response and determines a point at which the slope changes from negative to positive as the candidate point. The number of candidate points to be extracted by the candidate point determination unit 213 may be one, or two or more.

Figure 4:
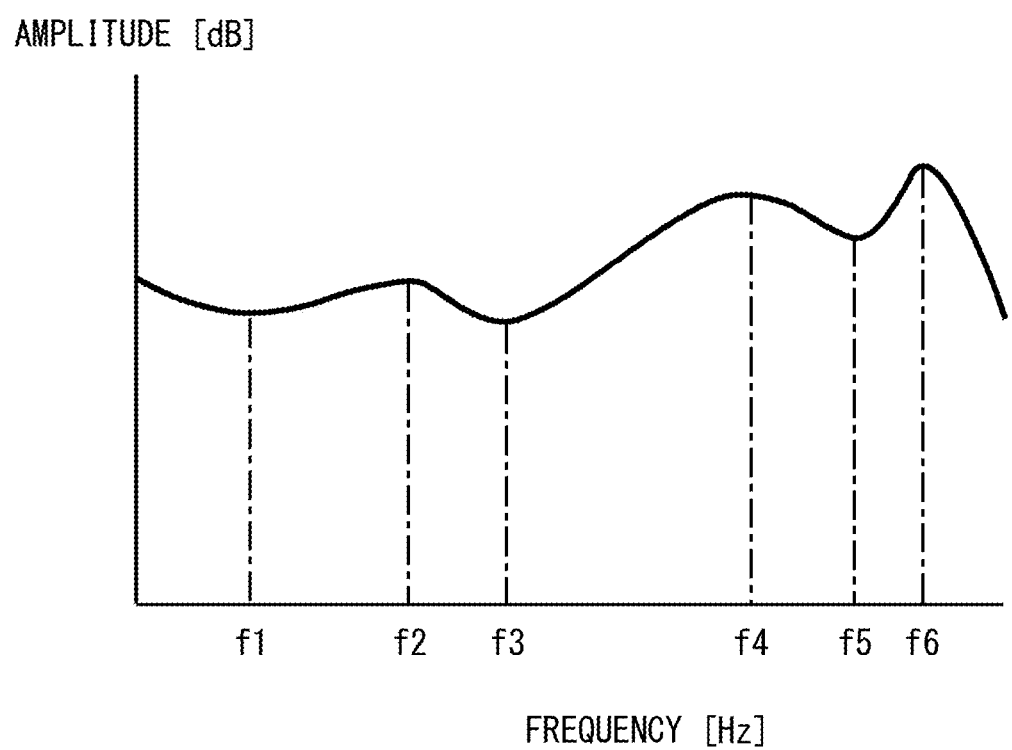
FIG. 4 is a graph showing a smoothed frequency response.

FIG. 4 is a graph schematically showing the smoothed response in smoothing processing performed in the smoothing unit 212. In FIG. 4, f1, f3 and f5 indicate the frequency at which the smoothed response reach its local minimum (bottom), which is the candidate point. Further, f2, f4 and f6 indicate the frequency at which the smoothed response reaches its local maximum (peak). The amplitude values of the frequencies f1 to f6 are A1 to A6, respectively. The amplitude value A3 is smaller than the amplitude value A1, and the amplitude value A1 is smaller than the amplitude value A5.

The split point determination unit 214 determines one or more band split points from the candidate points. The band split point is a frequency that serves as the boundary to split the bandwidth. The number of band split points is determined by the number of split bands, and it is not particularly limited. For example, when splitting the band into two, the number of band split points is one, and when splitting the band into three, the number of band split points is two. Four examples of methods of determining the split point from candidate points are described hereinafter.

In a first example, the split point determination unit 214 can determine all candidate points as the band split points. Specifically, all of the local minimums extracted from the smoothed response are the band split points. For example, in the smoothed response shown in FIG. 4, the frequency f1, the frequency f3 and the frequency f5 are the band split points. In this case, the number of split bands is 4. Thus, the frequency band ranging from the minimum frequency to the frequency f1 is a first band, the frequency band ranging from the frequency f1 to the frequency f3 is a second band, the frequency band ranging from the frequency f3 to the frequency f5 is a third band, and the frequency band ranging from the frequency f5 to the maximum frequency is a fourth band.

In a second example, the split point determination unit 214 determines the candidate point at which the amplitude value of the smoothed response is the smallest as the band split point. Because the amplitude value A3 is the smallest in the smoothed response of FIG. 4 described above, the frequency f3 is the band split point. The second example is applied to a case when the number of split points is 1, which is, when the number of split bands is 2. Thus, the frequency band ranging from the minimum frequency to the frequency f3 is a first band, and the frequency band ranging from the frequency f3 to the maximum frequency is a second band.

In a third example, the split point determination unit 214 determines the band split point based on the amplitude value of the smoothed response. For example, the candidate points corresponding to the necessary number of split points are extracted as the band split points in the ascending order of amplitude value. When the necessary number of split points is 2, the frequency f3 and the frequency f1 are the band split points in the smoothed response shown in FIG. 4. Thus, the frequency band ranging from the minimum frequency to the frequency f1 is a first band, the frequency band ranging from the frequency f1 to the frequency f3 is a second band, the frequency band ranging from the frequency f3 to the maximum frequency is a third band. The necessary number of split points is not limited to 2, and it may vary depending on the number of split bands. The number of split points may be 1, or 2 or more.

As described above, in the second example and the third example, the split point determination unit 214 determines the band split point based on the response value (amplitude value) of the smoothed response at the candidate point. Note that the response value is not limited to the amplitude value, and it may be a power value. For example, when the frequency response acquisition unit 211 acquires a power spectrum as the frequency response, a power value may be used as the response value. In this case, the candidate point with a small power value is determined as the band split point.

In a fourth example, the split point determination unit 214 determines the band split point based on the response value of the candidate point and the response value at a peak position (peak frequency). For example, the amplitude value at the candidate point is weighted with the response value (amplitude value) at the peak position adjacent to the candidate point. The candidate point with the frequency f1 is weighted with the amplitude value A2 of the peak frequency f2. The candidate point with the frequency f3 is weighted with the amplitude value A4 of the peak frequency f4. The candidate point with the frequency f5 is weighted with the amplitude value A6 of the peak frequency f6.

Then, using the weighted response value as an evaluation value, the split point determination unit 214 extracts the candidate points corresponding to the necessary number of split points in ascending order of evaluation values, and thereby determines the band split points. In the smoothed response shown in FIG. 4 described above, at the candidate point with the frequency f1, the amplitude value A1 is weighted with the amplitude value A2, and therefore the weighted evaluation value is (A1)/(A2). Likewise, at the candidate point with the frequency f3, the amplitude value A3 is weighted with the amplitude value A4, and therefore the weighted evaluation value is (A3)/(A4). At the candidate point with the frequency f5, the amplitude value A5 is weighted with the amplitude value A6, and therefore the weighted evaluation value is (A5)/(A6).

In this manner, as the response value of the local minimum is smaller, the evaluation value is smaller. Further, as the response value of the local maximum is larger, the evaluation value is smaller. A point with a smaller evaluation value is more likely to be the split point. It is assumed that (A3)/(A4) is smaller than (A5)/(A6), and (A5)/(A6) is smaller than (A1)/(A2). When the necessary number of split points is 2, the candidate point with the frequency f3 and the candidate point with the frequency f5 are the band split points. In this case, the frequency band ranging from the minimum frequency to the frequency f3 is a first band, the frequency band ranging from the frequency f3 to the frequency f5 is a second band, the frequency band ranging from the frequency f5 to the maximum frequency is a third band.

Although the evaluation value is calculated by assigning weights with the local maximum having a higher frequency than the local minimum among the two local maximums adjacent to the local minimum in the above-described example, the calculation of the evaluation value is not limited to the above example. The candidate point determination unit 213 may assign weights with the local maximum having a lower frequency than the local minimum among the two local maximums adjacent to the local minimum. The candidate point determination unit 213 may assign weights using both of the two adjacent local maximums. For example, a representative value may be calculated from the two local maximums adjacent to the local minimum, and weights may be assigned using this representative value. The candidate point determination unit 213 may assign weights using the average, maximum or median of the two local maximums adjacent to the local minimum as the representative value.

The split point determination unit 214 outputs the determined band split point to the band splitting unit 222. As described above, the split point determination unit 214 may determine different band split points for Lch and Rch. Alternatively, the split point determination unit 214 may determine the same band split point for Lch and Rch. Although the band split point is determined from the entire bandwidth in the above-described examples 1 to 4, the band split point may be determined by performing the above-described processing in an arbitrary frequency interval. In other words, no band split point may be extracted in a certain predetermined frequency interval.

The reproduced signal input unit 221 inputs the stereo reproduced signal to each of the band splitting unit 222 and the DRC processing unit 224. The band splitting unit 222 splits the stereo signals YL and YR from the filter units 41 and 42 into frequency bands at the band split point determined in the split point determination unit 214. The band splitting unit 222 calculates the frequency response of the reproduced signal by FFT or the like. Specifically, the band splitting unit 222 calculates the frequency response for each frame of the reproduced signal and splits the frequency response into a plurality of frequency bands. The frequency response acquisition unit 211 splits the frequency response into frequency bands at the band split point as the boundary frequency. The frequency response is thereby split into two or more frequency bands.

The parameter setting unit 223 sets parameters for DRC processing based on the reproduced signal that has been split into frequency bands. The parameter setting unit 223 sets a DRC compression ratio, attack time, release time and the like as parameters. The parameter setting unit 223 calculates a difference between the maximum signal level and a threshold for each of the split frequency bands. The parameter setting unit 223 then calculates a frequency band with the largest level difference from the two or more frequency bands. The parameter setting unit 223 sets parameters for DRC adjustment based on the frequency band with the largest level difference.

For example, when splitting a band into first to third frequency bands, the maximum signal level of the frequency band is calculated in each of the first to third frequency bands. The maximum signal level is the maximum amplitude value in each frequency band. Then, the parameter setting unit 223 determines a frequency band with the largest level difference between the maximum signal level and a threshold. The parameter setting unit 223 selects the parameters in the frequency band with the largest level difference. For example, when the level difference in the second frequency band is larger than the level difference in the first frequency band and the third frequency band, the parameter setting unit 223 calculates the parameters from the response in the second frequency band. The parameter setting unit 223 sets the parameters from the maximum signal level or the like in the second frequency band.

The parameters are adjustment values to determine the response characteristics, such as a compression ratio, an attack time and a release time, for example. The parameters are not limited to a compression ratio, an attack time and a release time as a matter of course. The parameter setting unit 223 sets the parameters based on the signal (characteristics) of one frequency band among a plurality of split frequency bands. The parameter setting unit 223 then outputs the set parameters to the DRC processing unit 224. The parameters in DRC processing are thereby set. Note that the parameters in DRC processing may be common or different between Lch and Rch.

The DRC processing unit 224 performs DRC processing on the reproduced signal based on the set parameters. For example, when the signal level of the reproduced signal is lower than the threshold, the DRC processing unit 224 sets the compression ratio to 1. On the other hand, when the signal level of the reproduced signal exceeds the threshold, the DRC processing unit 224 sets the compression ratio to suppress the reproduced signal after the attack time. In other words, the DRC processing unit 224 compresses the reproduced signal at the set compression ratio after the attack time. Then, when the signal level falls below the threshold in this state, the compression is continued until the release time has elapsed. After the elapse of the release time, DRC processing is stopped by setting the compression ratio to 1. In this manner, when the signal level of the reproduced signal exceeds the threshold, the DRC processing unit 224 performs dynamic range compression with the set parameters.

Then, the reproduced signal output unit 225 outputs, to the headphones 43, the reproduced signal on which DRC processing has been performed in the DRC processing unit 224. The headphones 43 outputs, to the user U, the reproduced signal on which DRC processing has been performed. The out-of-head localization device 100 thereby performs out-of-head localization by using the stereo signals on which DRC processing has been performed.

The above-described processing enables determination of the appropriate split point, and it is thereby possible to perform appropriate DRC processing without undermining the filter effect. For example, filter processing that emphasizes a certain frequency is performed in out-of-head localization. In this case, if the band split point in DRC processing is determined at random, while the sound volume is appropriate, the filter effect can be degraded. Further, when not performing DRC processing, a certain frequency band is emphasized more than necessary in out-of-head localization in some combinations of filters and input signals, which can cause signal clipping. By determining the band split point based on the frequency response of filters as described in this embodiment, it is possible to appropriately perform out-of-head localization. Particularly, by determining the band split point by using filters obtained by individual measurement on the user U, it is possible to enhance the effect of out-of-head localization.

Further, the split point is determined by using the bottom position (local minimum) of the smoothed response as the candidate point. This enables splitting into frequency bands containing a frequency emphasized by filters, thereby achieving frequency band splitting that does not undermine the filter effect. It is thereby possible to appropriately set the parameters for DRC processing.

By calculating the evaluation value based on the values of the smoothed response at the bottom position (local minimum) and the peak position (local maximum) as described in the fourth example, it is possible to make splitting into more appropriate frequency bands. For example, by determining the band split point based on the evaluation value, it is possible to make splitting into frequency bands with a large difference between the bottom and the peak. It is thereby possible to appropriately set the parameters for DRC processing. Further, it is possible to set the number of split points to an appropriate number. Because there is no need to set a large number of split points, it is possible to reduce the processing amount in DRC processing.

Figure 5:
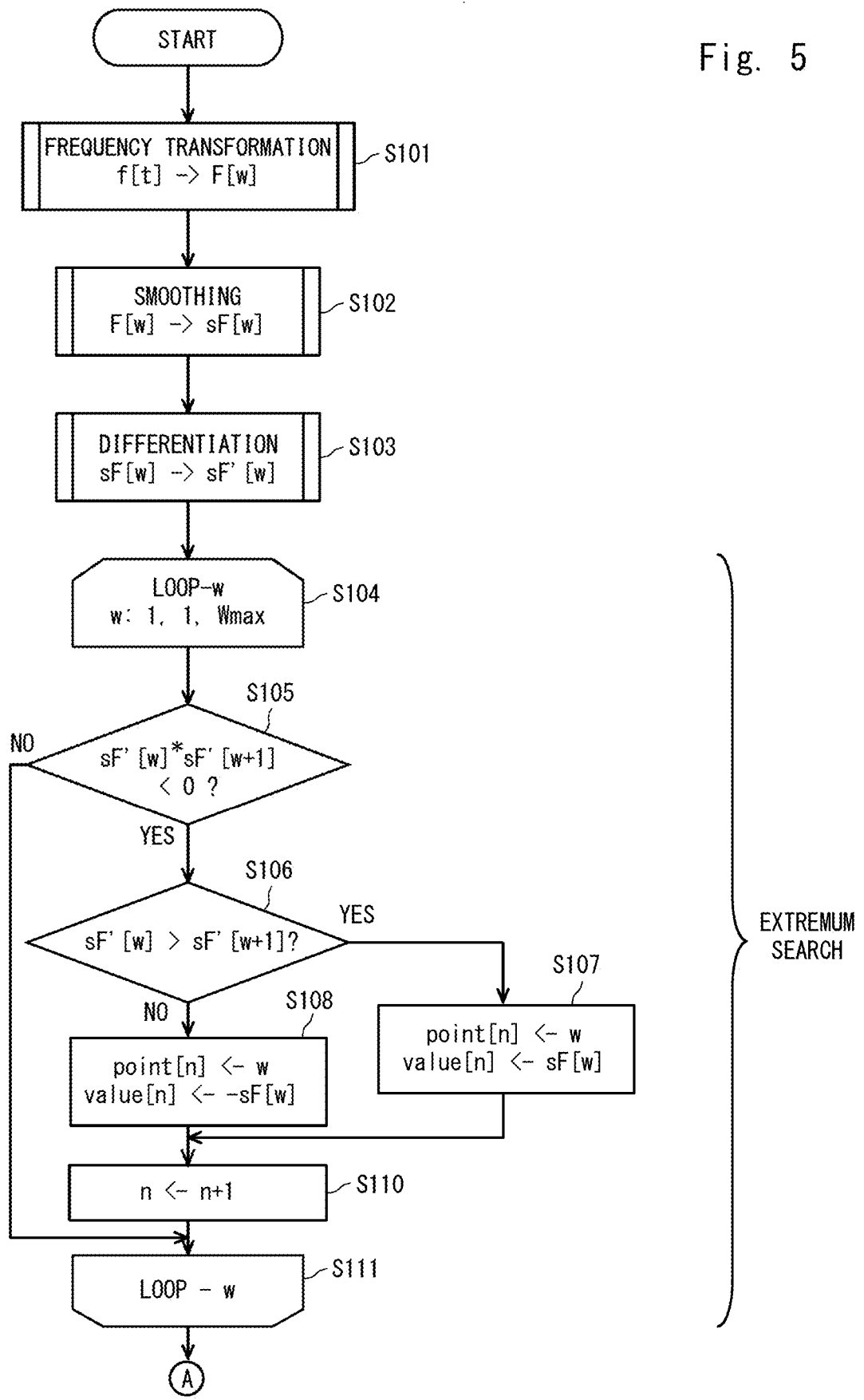
FIG. 5 is a flowchart showing a processing method.
Figure 6:
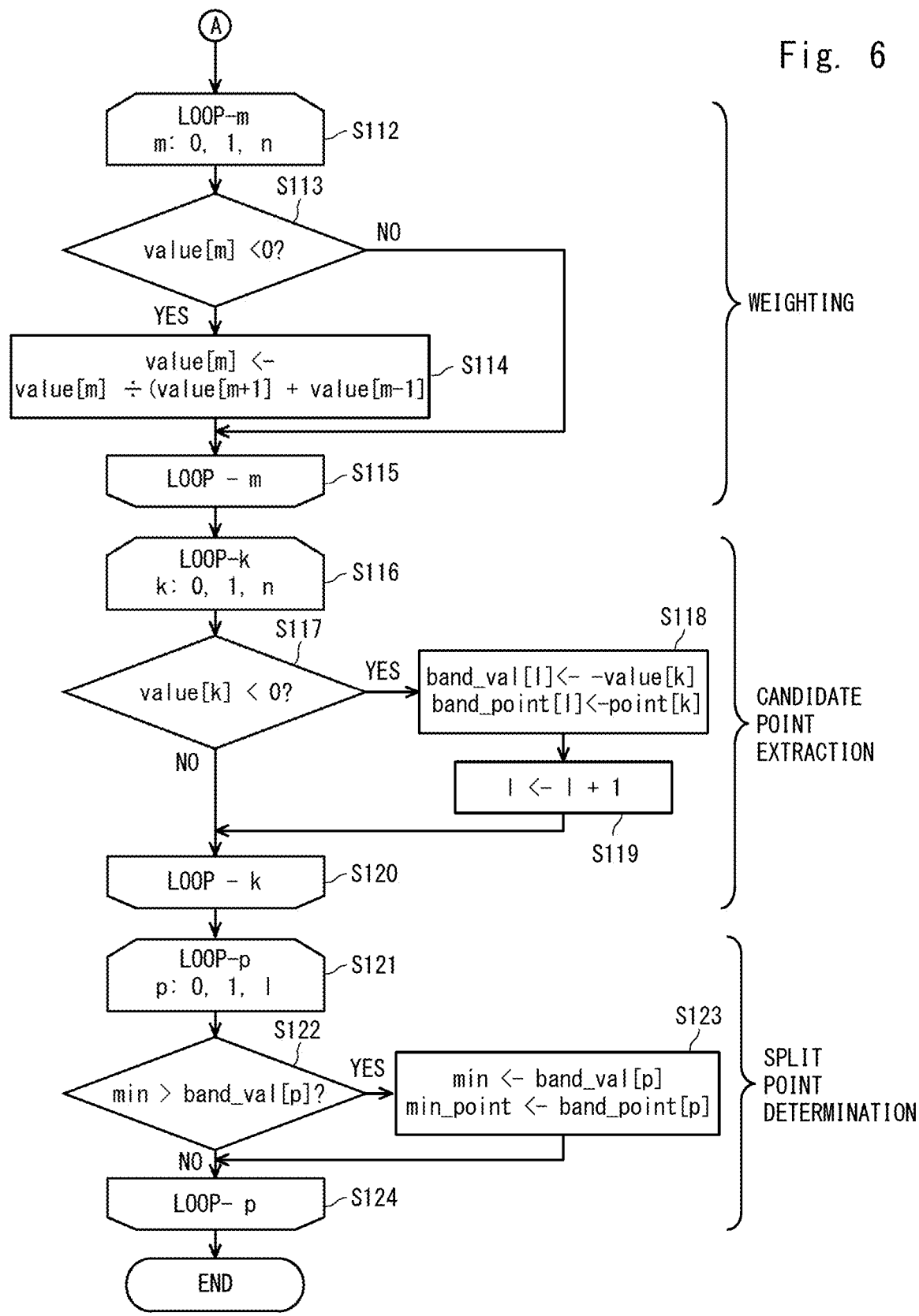
FIG. 6 is a flowchart showing a processing method.

An example of a processing method according to this embodiment is described hereinafter with reference to FIGS. 5 and 6. FIGS. 5 and 6 are flowcharts showing a processing method according to this embodiment. The process shown in FIGS. 5 and 6 determines the band split point by using the evaluation value obtained by weighting the amplitude value of the local minimum with the amplitude value of the local maximum.

First, the frequency response acquisition unit 211 performs frequency transformation to acquire the frequency response of a filter (S101). For example, the frequency response acquisition unit 211 performs discrete Fourier transform, and thereby a time-domain filter f[t] is transformed into a frequency response F[w]. Note that w indicates an integer (which is referred to also as a frequency point) indicating a data point of a frequency in the frequency response and, to be specific, w is 1, 2, 3, . . . , Wmax. Thus, w corresponds to a frequency in the frequency response. The frequency becomes higher as the number of w increases, for example.

The smoothing unit 212 smoothes the frequency response F[w] (S102). For example, the smoothing unit 212 smoothes the frequency response F[w] by an envelope detection method, an approximation method using a spline curve or the like. A smoothed response sF[w] is thereby obtained.

The candidate point determination unit 213 differentiates the smoothed response sF[w] (S103). A differential response sF'[w] is thereby obtained from the smoothed response sF[w]. The differential response sF'[w] indicates the slope of the smoothed response sF[w].

Next, the candidate point determination unit 213 performs loop processing that increments w by one from 1 to Wmax (S104). The loop processing of w is processing for searching for the extrema of the smoothed response sF[w] as described below.

In the loop processing of w, the candidate point determination unit 213 first determines whether sF'[w]*sF'[w+1] is smaller than 0 or not (S105). The extrema of the smoothed response sF[w] can be extracted by determining whether the signs of two adjacent differential values are different or not. Specifically, when one of two successive values of the differential response sF'[w] is a positive value and the other one is a negative value, sF'[w]*sF'[w+1] is smaller than 0, and the smoothed response sF[w] is the extremum. On the other hand, when both of two successive values of the differential response sF'[w] are positive values, or both of them are negative values, sF'[w]*sF'[w+1] is equal to or more than 0, and the smoothed response sF[w] is not the extremum.

When it is determined that sF'[w]*sF'[w+1] is smaller than 0 (Yes in S105), the candidate point determination unit 213 determines whether sF'[w] is larger than sF'[w+1] (S106).

When it is determined that sF'[w] is larger than sF'[w+1] (Yes in S106), the candidate point determination unit 213 sets w=point[n] and sF[w]=value[n] (S107). Note that point [n] is a frequency point with an extremum, and value[n] is the amplitude value of the smoothed response at the extremum. As described later, value[n] indicates the evaluation value for calculating the split point. Further, n is a value (an integer of 1 or more) indicating the number of extrema of the smoothed response.

When it is determined that sF'[w] is larger than sF'[w+1], the smoothed response sF[w] has a local maximum. Specifically, because sF'[w] is positive and sF'[w+1] is negative, the smoothed response sF[w] has a local maximum. In Step S107, the candidate point determination unit 213 stores w with the local maximum and the value of this smoothed response sF[w] as point[n] and value[n], respectively, into a memory or the like. Then, the candidate point determination unit 213 increments n (S110). The candidate point determination unit 213 then increments w and continues loop processing of w (S111). The candidate point determination unit 213 thereby returns to S105 and searches for the next extremum.

When it is determined that sF'[w] is not larger than sF'[w+1] (No in S106), the candidate point determination unit 213 sets w=point[n] and −sF[w]=value[n] (S108). When sF'[w] is smaller than sF'[w+1], the smoothed response sF[w] has a local minimum. Specifically, because sF'[w] is negative and sF'[w+1] is positive, the smoothed response sF[w] has a local minimum. Thus, in Step S108, the candidate point determination unit 213 stores w with the local minimum and the value of this smoothed response sF[w] with the negative sign as point[n] and value[n], respectively, into memory or the like. Then, the candidate point determination unit 213 increments n (S110).

When it is determined that sF'[w]*sF'[w+1] is not smaller than 0 (No in S105), or when n is incremented (S110), w is incremented, and loop processing is repeated (S111). Thus, the candidate point determination unit 213 performs the processing of S105 to S110 on all frequency points. The candidate point determination unit 213 continues the loop processing of w until w reaches Wmax. The candidate point determination unit 213 can thereby extract all of the local maximums and the local minimums of the smoothed response. The candidate point determination unit 213 stores the frequency points and amplitude values of all the extrema. Note that, when the smoothed response is a local maximum, value[n] has a positive value, and when the smoothed response is a local minimum, value[n] has a negative value.

In the loop processing of w, the candidate point determination unit 213 performs the processing of S105 to S110 until w reaches Wmax. It is thereby possible to search for all extrema. Note that the number of extrema is n.

When the loop processing of w ends, the candidate point determination unit 213 performs loop processing that increments m (an integer of 0 or more) by one from 0 to n (S112). Note that n is a value indicating the number of extrema as described above. The loop processing of m is processing of assigning weights to extrema as described below.

In the loop processing of m, the candidate point determination unit 213 first determines whether value[m] is smaller than 0 or not (S113). At the local minimum, value[m] is a negative value of the amplitude value, and value[m] is smaller than 0. Thus, in S113, it is determined whether the extremum is a local minimum or a local maximum.

When value[m] is smaller than 0 (Yes in S113), the candidate point determination unit 213 sets value[m]=value [m]/(value[m−1]+value[m+1]) (S114). value[m] is smaller than 0, it is a local minimum, and the candidate point determination unit 213 assigns weights and thereby calculates the evaluation value. Specifically, the amplitude value (value[m]) of the local minimum is weighted with the amplitude values (value[m−1], value[m+1]) of two local maximums adjacent to the local minimum, thereby calculating the evaluation value. The evaluation value[m] can be thereby calculated. Then, the candidate point determination unit 213 returns to S112 and calculates the evaluation value for the next extremum.

When it is determined that value[m] is not smaller than 0 (No in S113), the extremum is not the candidate point, and the candidate point determination unit 213 continues the loop processing of m (S115). Specifically, because value[m] is a local maximum, there is no need to assign weights for calculating the evaluation value. Thus, the candidate point determination unit 213 continues the loop processing of m (S116). The candidate point determination unit 213 returns to S112 and calculates the evaluation value for the next extremum (local minimum).

In the loop processing of m, the candidate point determination unit 213 performs the processing of S112 to S115 until m reaches n. It is thereby possible to calculate the evaluation values value[1] to value[n] of all extrema.

When the loop processing of m ends, the candidate point determination unit 213 performs loop processing that increments k (an integer of 0 or more) by one from 0 to n (S116). The loop processing of k is processing for extracting a local minimum as the candidate point.

In the loop processing of k, the candidate point determination unit 213 first determines whether value[k] is smaller than 0 or not (S117). When it is determined that value[k] is smaller than 0 (Yes in S117), the candidate point determination unit 213 sets band_val(l)=−value[k] and band_point (l)=point[k] (S118). Note that band_point(l) is a frequency point corresponding to the frequency of the candidate point, and band_val(l) is the evaluation value at this frequency point. Further, l is an integer indicating the number of candidate points, which is, the number of local minimums. The initial value of l is 1. When value[k] is smaller than 0, it is a local minimum, and the candidate point determination unit 213 determines the extremum (local minimum) as the candidate point. Then, the candidate point determination unit 213 increments l (S119). The candidate point determination unit 213 increments k and repeats loop processing (S120).

When it is determined that value[k] is not smaller than 0 (No in S117), the candidate point determination unit 213 increments k and repeats loop processing (S120). When value[k] is not smaller than 0, it is a local maximum, and the extremum is not the candidate point. Then, the loop processing of k is performed until k reaches the number of extrema (n). The processing of S116 to S120 is thus performed on all extrema. All local minimums are thereby extracted as the candidate points. The number of candidate points is 1.

Next, the split point determination unit 214 performs loop processing that increments p (an integer of 0 or more) by one from 0 to 1 (S121). The loop processing of p is processing for determining the split point from the candidate point. To be specific, one candidate point with the lowest evaluation value among a plurality of candidate points is the split point.

First, the split point determination unit 214 determines whether band_val(p) is smaller than a minimum value min (S122). Note that the minimum value min is a value indicating the minimum value of the evaluation value. Further, the initial value of the minimum value min is set to a value higher than all evaluation values band_val(1) to band_val (1).

When it is determined that band_val(p) is smaller than the minimum value min (Yes in S122), the split point determination unit 214 sets min=band_val(p) and min_point(p) =band_point(p) (S123). min_point(p) indicates a frequency point at the split point. The split point determination unit 214 continues the loop of p (S124).

When it is determined that band_val(p) is not smaller than the minimum value min (No in S122), the split point determination unit 214 increments p and repeats loop processing (S124). By repeating loop processing until p reaches 1, the candidate point with the lowest evaluation value is obtained. The split point determination unit 214 determines the candidate point with the lowest evaluation value as the split point.

The split point can be determined by the above-described process. Because the value of the local minimum is weighted with the value of the local maximum (peak), it is possible to determine an appropriate split point. The candidate point with a large difference between the adjacent local maximum and local minimum can be set as the split point. The number of split points is not limited to 1, and it may be a specified number of 2 or more. In this case, a specified number of candidate points may be extracted in ascending order of evaluation points and set as the split points.

Because an appropriate split point can be determined by the above process, it is possible to perform appropriate DRC processing without undermining the filter effect. The steps in the process described above may be performed in a different order.

A part or the whole of the above-described processing may be executed by a computer program. The above-described program can be stored and provided to the computer using any type of non-transitory computer readable medium. The non-transitory computer readable medium includes any type of tangible storage medium. Examples of the non-transitory computer readable medium include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable medium. Examples of the transitory computer readable medium include electric signals, optical signals, and electromagnetic waves. The transitory computer readable medium can provide the program to a computer via a wired communication line such as an electric wire or optical fiber or a wireless communication line.

Although embodiments of the invention made by the present invention are described in the foregoing, the present invention is not restricted to the above-described embodiments, and various changes and modifications may be made without departing from the scope of the invention.

The present disclosure is applicable to audio signal processing technology.

What is claimed is:

1. A processing device comprising:
a storage medium configured to store a program; and
at least one processor coupled to the storage medium and configured to execute the program to:
acquire a frequency response of a filter for an audio signal;
smooth the frequency response and obtain a smoothed response;
determine a plurality of candidate split points based on a bottom position as a local minimum amplitude of the smoothed response; and
determine one or more band split points based on the plurality of candidate split points.

2. The processing device according to claim 1, wherein the at least one processor is further configured to determine the band split point based on a value of the smoothed response at the bottom position or a peak position adjacent to the bottom position.

3. The processing device according to claim 1, wherein the at least one processor is further configured to:
split a reproduced signal into frequency bands at the band split point;
calculate a parameter based on the reproduced signal split into frequency bands; and
perform dynamic range compression of the reproduced signal by using the parameter.

4. The processing device according to claim 3, wherein the dynamic range compression is performed on the reproduced signal on which out-of-head localization has been performed using the filter.

5. A processing method comprising:
a step of acquiring a frequency response of a filter for an audio signal;
a step of smoothing the frequency response and obtaining a smoothed response;
a step of determining a plurality of candidate split points based on a bottom position as a local minimum amplitude of the smoothed response; and
a step of determining one or more band split points based on the plurality of candidate split points.

6. A non-transitory computer readable medium storing a program causing a computer to execute a processing method comprising:
a step of acquiring a frequency response of a filter for an audio signal;
a step of smoothing the frequency response and obtaining a smoothed response;
a step of determining a plurality of candidate split points based on a bottom position as a local minimum amplitude of the smoothed response; and a step of determining one or more band split points based on the plurality of candidate split points.

* * * * *